United States Patent [19]
Lu et al.

[11] Patent Number: 6,107,177
[45] Date of Patent: Aug. 22, 2000

[54] SILYLATION METHOD FOR REDUCING CRITICAL DIMENSION LOSS AND RESIST LOSS

[75] Inventors: Zhijian Lu, Poughkeepsie; Wayne Moreau, Wappingers Falls, both of N.Y.

[73] Assignees: Siemens Aktienesellschaft, Munich, Germany; International Business Machines Corporation, Armonk, N.Y.

[21] Appl. No.: 09/382,933

[22] Filed: Aug. 25, 1999

[51] Int. Cl.$^7$ .................................................. H01L 21/44
[52] U.S. Cl. ........................ 438/597; 438/624; 438/638; 438/700
[58] Field of Search .................................. 438/700, 725, 438/624, 638, 597, 789, 623, 637, 780, 672, 675, 948, 723, 743, 790

[56] References Cited

U.S. PATENT DOCUMENTS

| | | | |
|---|---|---|---|
| 4,368,989 | 1/1983 | Kawashima | 368/74 |
| 4,803,181 | 2/1989 | Buchmann et al. | 438/696 |
| 4,981,909 | 1/1991 | Babich et al. | 525/102 |
| 5,162,559 | 11/1992 | Wilharm et al. | 556/411 |
| 5,362,599 | 11/1994 | Knors et al. | 430/192 |
| 5,368,989 | 11/1994 | Flaim et al. | 430/271 |
| 5,401,614 | 3/1995 | Dichiara et al. | 430/323 |
| 5,492,793 | 2/1996 | Breyta et al. | 430/270.14 |
| 5,539,249 | 7/1996 | Roman et al. | 257/649 |
| 5,580,694 | 12/1996 | Allen et al. | 430/270.1 |
| 5,607,824 | 3/1997 | Fahey et al. | 430/510 |
| 5,876,900 | 3/1999 | Watanabe et al. | 430/288.1 |
| 5,877,075 | 3/1999 | Dai et al. | 438/597 |

*Primary Examiner*—Chandra Chaudhari
*Assistant Examiner*—Hsien Ming Lee
*Attorney, Agent, or Firm*—Donald B. Paschburg

[57] ABSTRACT

A method for reducing critical dimension loss and resist loss dimensions during etching includes providing a dielectric layer having an anti-reflection layer formed thereon and patterning a resist layer on the anti-reflection layer. The resist layer is exposed to an agent including silicon, and the agent is reacted with the resist to form a silylation region on exposed surfaces of the resist layer. The anti-reflection layer is etched by employing the silylation regions as an etch mask wherein the silylation regions have a greater resistance to etching than the antireflection layer and the resist layer.

20 Claims, 5 Drawing Sheets

SILYLATION METHOD FOR REDUCING CRITICAL DIMENSION LOSS AND RESIST LOSS

BACKGROUND

1. Technical Field

This disclosure relates to semiconductor fabrication and more particularly, to a method for silyation of semiconductor devices to reduce resist loss and more reliably provide critical dimension (CD) structures.

2. Description of the Related Art

As a result of technological improvements in semiconductor fabrication, aggressively shrinking device ground rules are needed to increase the productivity and efficiency of optical lithography processes. In semiconductor fabrication processes an anti-reflection coating (ARC) is formed prior to the formation of a resist layer. Thinning the resist to open up the lithographic process window has been the trend in conventional processes. Also, a thick ARC is employed to suppress substrate variations. However, critical dimensions and resist thickness loss during an ARC open process become more and more pronounced when thinner resist and thicker ARC are used.

The use of high oxygen or carbon monoxide flow in ARC open processes not only consumes a lot of resist, but also lateral etching due to oxygen will cause critical dimension loss. This is especially pronounced in processes which typically include a resist to ARC selectivity of about 1:1. This means that to open 100 nm of ARC, 100 nm of resist is consumed. For example, in a Dual Damascene (DD) process, the use of high oxygen flow to minimize "fences" in trench etching (via first) can introduce as large as a 60 nm etch bias (etch bias=after-etch critical dimension–before-etch critical dimension). (Fences are structures which protrude into an upper trench after etching the trench when a via is etched first and a trench second for the dual damascene structure.) Therefore, lithographers have to underexpose line/space patterns to address this problem, which significantly reduces the lithographic process window. Moreover, oxygen and/or carbon monoxide containing etch chemistries in the ARC open process usually increase scalloping of the resist, and/or resist pattern transfer irregularity. This significantly degrades the lithographic process window as well.

Therefore, a need exists for a method of protecting the resist and critical dimensions during an ARC open process. A further need exists for a method which permits the use of a relatively thin resist with a thicker ARC layer below the resist layer.

SUMMARY OF THE INVENTION

A method for reducing critical dimension loss and resist loss dimensions during etching includes providing a dielectric layer having an anti-reflection layer formed thereon and patterning a resist layer on the anti-reflection layer. The resist layer is exposed to an agent including silicon, and the agent is reacted with the resist to form a silylation region on exposed surfaces of the resist layer. The anti-reflection layer is etched by employing the silylation regions as an etch mask wherein the silylation regions have a greater resistance to etching than the antireflection layer and the resist layer.

Another method for maintaining critical dimensions and providing etch resistance to resist materials during etching includes providing a dielectric layer having an antireflection layer formed thereon and forming a resist on the antireflection layer. The resist is patterned by employing photolithography and the resist is silylated by employing a dry chemistry silicon-containing agent to form silylation regions on surfaces of the resist. The antireflection layer is etched through into the dielectric layer by employing the silylation regions as an etch mask wherein the silylation regions protect the resist layer from scalloping.

A method for forming a dual damascene structure includes providing a dielectric layer having an antireflection layer formed thereon, patterning a first resist layer on the anti-reflection layer and exposing the first resist layer to an agent including silicon, the agent for reacting with the first resist layer to form a silylation region on exposed surfaces of the first resist layer. The anti-reflection layer is etched by employing the silylation regions as an etch mask wherein the silylation regions have a greater resistance to etching than the antireflection layer and the first resist layer, and a via is formed in the dielectric layer. The first resist layer is removed, and a second resist layer is patterned on the anti-reflection layer. The second resist layer is exposed to an agent including silicon. The agent reacts with the second resist layer to form a silylation region on exposed surfaces of the second resist layer. The anti-reflection layer is etched by employing the silylation regions as an etch mask wherein the silylation regions have a greater resistance to etching than the antireflection layer and the second resist layer. A conductor trench is then formed in the dielectric layer to form a dual damascene structure.

In other methods, the step of exposing the resist layer to an agent may including silicon may include the step of exposing the resist layer to hexamethyl disilazane. The hexamethyl disilazane is preferably introduced as a dry chemistry. The method may further include the step of maintaining a temperature of between about 50 degrees Celsius and about 150 degrees Celsius during the exposing step. The method may also include the step of maintaining a pressure of between about 1 Torr and about 200 Torr during the exposing step. The resist layer may include a deep ultraviolet sensitive resist which preferably includes OH agents. The step of patterning a resist layer on the anti-reflection layer may include the step of forming the resist layer with a depth smaller than the depth of the antireflection layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method for silyation of semiconductor devices to reduce resist loss and more reliably provide critical dimension (CD) structures. The present invention includes a silylation process after resist patterning to build etch resistance of a resist material prior to opening an anti-reflection coating (ARC) layer. The present invention builds sufficient etch resistance of the resist material to both open the ARC layer and to etch an underlying layer. The present invention will now be described in greater detail. The discussion of the present invention will illustratively incorporate a dual damascene structure for convenience. However, the present invention is broader and may be applied to any structure employing a resist and an anti-reflection coating.

Figure 1:
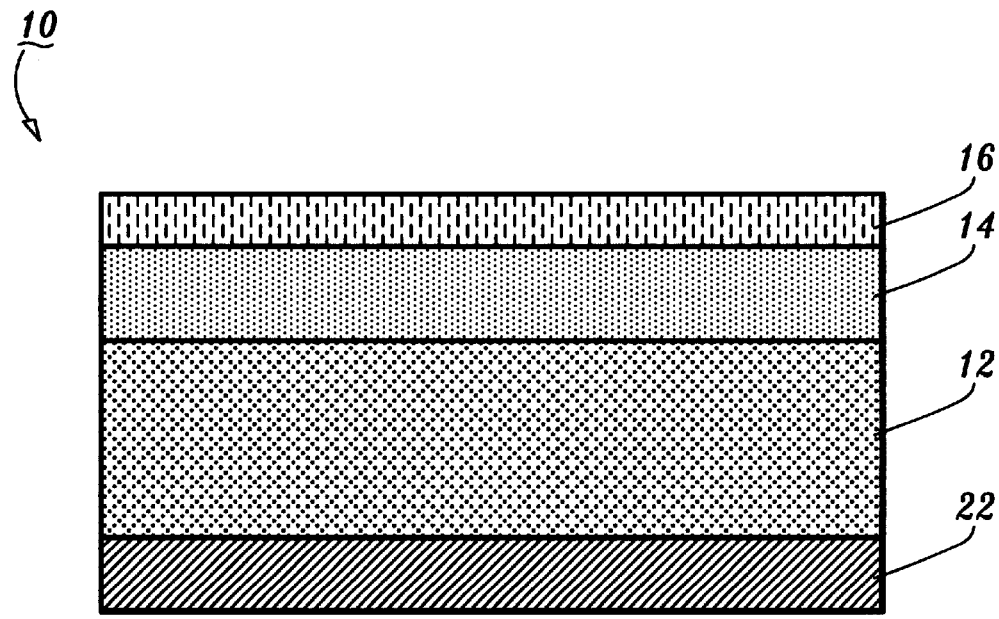
FIG. 1 is a cross-sectional view of a semiconductor device showing a dielectric layer with and antireflection coating and a resist layer deposited thereon in accordance with the present invention.

Referring now in specific detail to the drawings in which like reference numerals identify similar or identical elements throughout the several views, and initially to FIG. 1, a semiconductor device, generally referred to as device 10, is shown. Device 10 may include a memory device, a processor, chip or any other integrated circuit device. Device 10 is shown as a partially fabricated device which may include semiconductor components above and below the layer shown in the figures. Illustratively, in accordance with the present invention, a dielectric layer 12 is included. Dielectric layer 12 may include an oxide, a nitride, a glass or other suitable dielectric material. An antireflection coating (ARC) layer 14 is formed on dielectric layer 12. Planarized organics are preferred, such as DUV 30 available commercially from Brewer Science, Inc. Other types of ARCS may be employed as well, as described in U.S. Pat. Nos. 5,368,989, 5,401,614, 5,539,249 and 5,607,824, all incorporated herein by reference. ARC layer 14 preferably includes an organic material which reduces light reflections of light incident thereon. A resist layer 16 is formed on ARC layer 14. Resist layer is preferably a deep ultraviolet (DUV) sensitive material. Resist layer 16 may include polyhydrosterene type DUV resists, for example, ESCAP and Acetal resists, as described in U.S. Pat. Nos. 5,492,793 and 5,876,900, incorporated herein by reference. Other types of resist are contemplated as well, for example, 193 resists, as described in U.S. Pat. No. 5,580,694 or novalak resists, as described in U.S. Pat. No. 5,362,599, both incorporated herein by reference. It is preferable that resist layer 16 includes a resist having OH active groups. In accordance with the present invention, resist layer 16 may be thinner than ARC layer 14, but is preferably thicker than ARC layer 14. Resist layer 16 will experience less scalloping at higher thicknesses.

Figure 2:
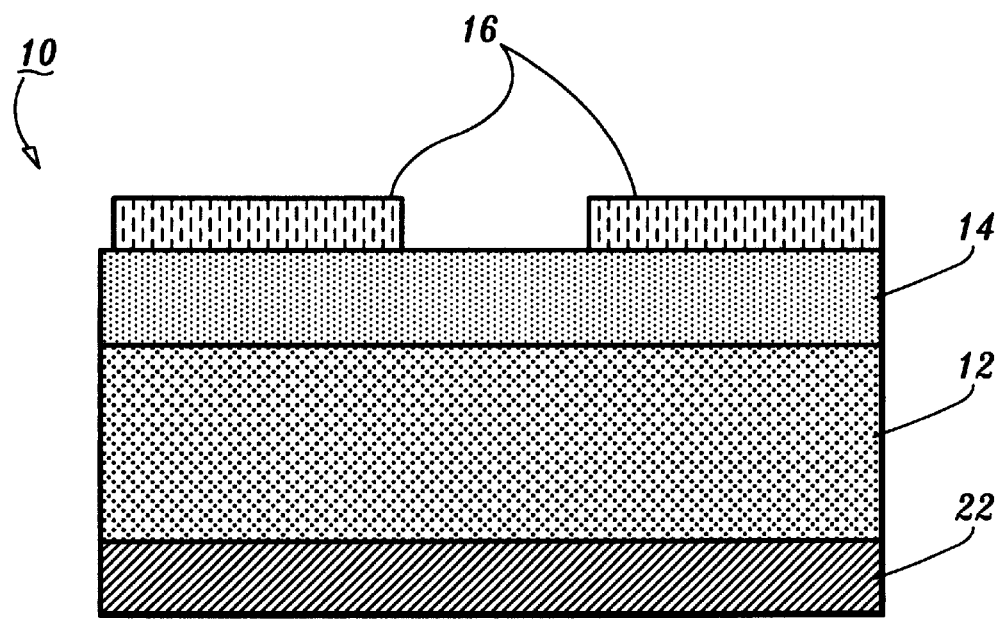
FIG. 2 is a cross-sectional view of the semiconductor device of FIG. 1 showing the resist layer patterned in accordance with the present invention.

Referring to FIG. 2, resist layer 16 is patterned by employing photolithographic techniques. Resist layer 16 is exposed to light (or other radiation, such as electrons) and developed to open up portions of resist layer to expose ARC layer 14. Light incident on ARC layer 14 is in large part absorbed.

Figure 3:
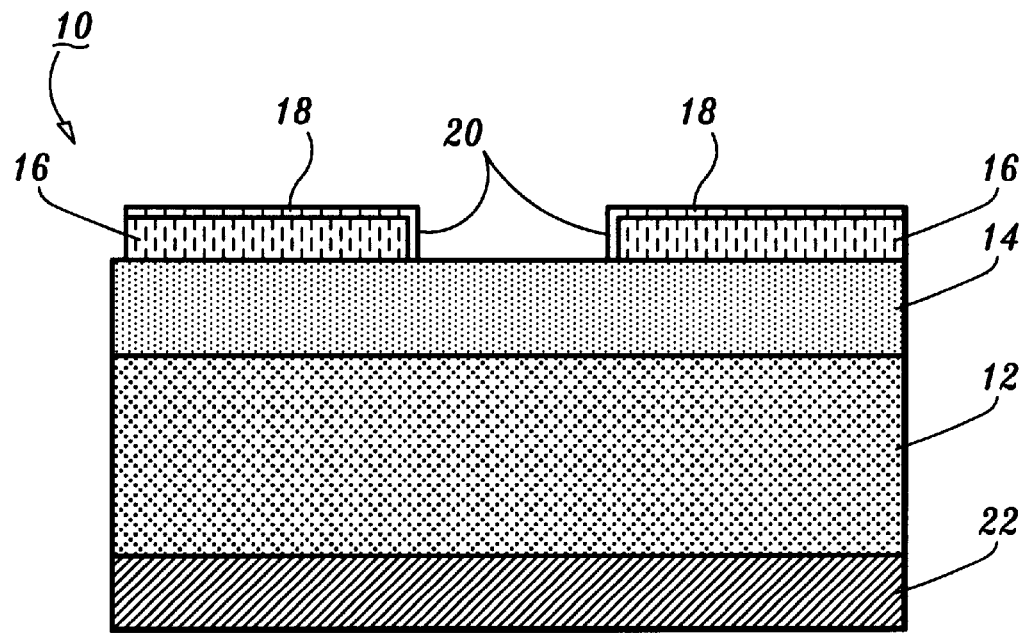
FIG. 3 is a cross-sectional view of the semiconductor device of FIG. 2 showing the resist layer silylated in accordance with the present invention.

Referring to FIG. 3, resist layer 16 is silylated to form a silylation region 18 by exposing resist layer to Si-containing agents. In a preferred embodiment the Si-containing agent includes hexamethyl disilazane (HMDS), hexamethylcyclotrisilazane, trimethylsilyl ethyl isocyanate and/or dimethylsilyldimethylamine. The Si-containing agent may preferably be supplied as a gas in a dry silylation method. One dry silylation method includes providing HMDS at a temperature between about 50 and about 150 degrees Celsius, and a pressure of between about 1 and about 200 Torr. Other temperatures and pressures may be employed depending on the amount of silylation desired. For example, if it is desired to silylate a depth of approximately 30 nm into resist layer 16, HMDS exposure time would be about 10 seconds at about 90 degrees Celsius and about 50 Torr. In other embodiments, silylation may be provided by employing either a wet chemistry or dry chemistry method. One wet silylation method which may be used is described in U.S. Pat. No. 4,803,181 to Buchmann et al., incorporated herein by reference. However, dry chemistries are preferred. Dry chemistries provide a more uniform and controlled silylation process. In preferred embodiments, silylation region 18 includes a depth between about 1 nm to about 100 nm. Other depths may be employed as well.

Figure 4:
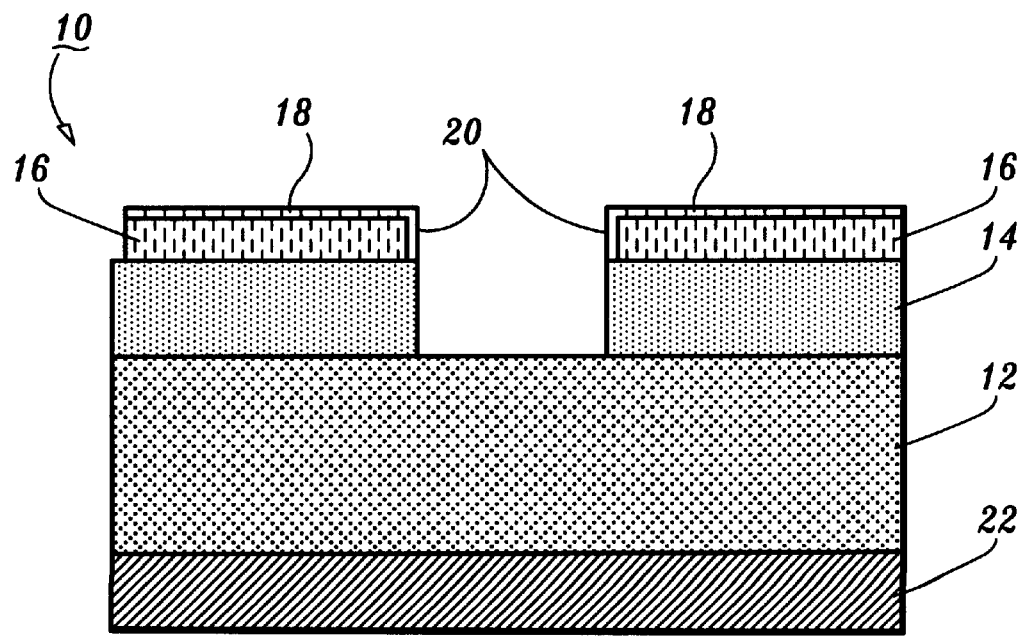
FIG. 4 is a cross-sectional view of the semiconductor device of FIG. 3 showing the antireflection layer opened in accordance with the present invention.

Referring to FIG. 4, resist layer 16, and more specifically silylation region 18, is employed as an etch mask to open ARC layer 14 to expose dielectric layer 12. Etching of ARC layer 14 is preferably carried out by employing an anisotropic etch process. For example, a reactive ion etch process employing oxygen ions is utilized. By employing silylation region 18, which includes $SiO_x$ species in an oxidizing atmosphere of the ARC open process, resist consumption during ARC open will be minimized with silylation region 18 on top of ARC layer 14, due to high selectivity of oxide to organic ARCs. Selectivities of silylation region 18 to ARC layer 14 may be between about 1:2 to about 1:10. Higher selectivities may be achieved as well.

Figure 5:
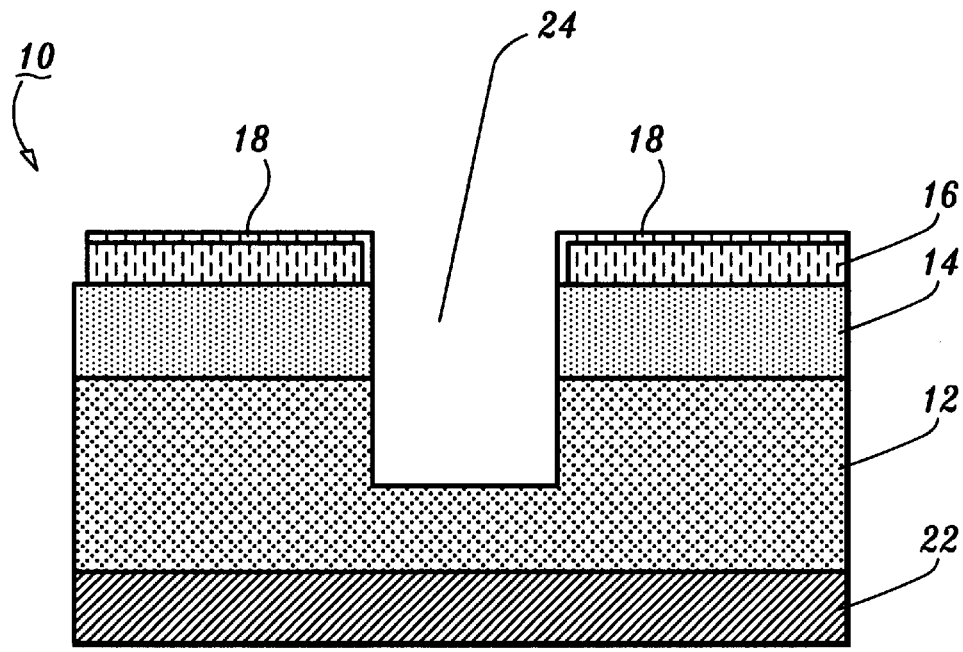
FIG. 5 is a cross-sectional view of the semiconductor device of FIG. 4 showing the dielectric layer etched in accordance with the present invention.

Referring to FIG. 5, with silylation region 18, scalloping associated with ARC layer 14 open is reduced. For example, testing of the present invention by the inventors has indicated that Si-containing resists (silylation region 18) showed different mechanisms for scalloping. Scalloping may include a waviness or unevenness of resist surfaces. The resistive surfaces of silylation region 18 advantageously provide surfaces resistive to scalloping. This improves the ability to maintain dimensions for etched structures provided by the resist pattern of resist layer 16. Dielectric layer 12 is etched into dielectric layer to form a hole or trench 24. Depending on the application, etching may be continued down to an underlying layer 22. Layer 22 may include a metal line, a contact, a semiconductor substrate or another dielectric layer. Depending on the materials used for ARC layer 14, dielectric layer 12 and underlying layer 22, silylation regions 18 may even be used to etch into layer 22.

Figure 6:
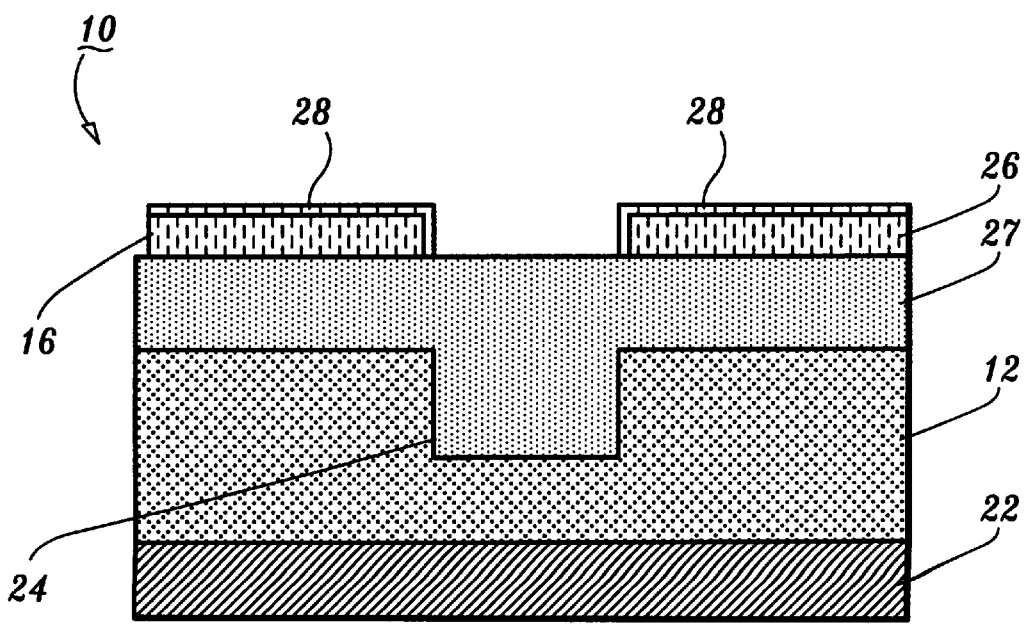
FIG. 6 is a cross-sectional view of the semiconductor device of FIG. 5 showing an additional resist layer patterned and silylated after the removal of the resist layer of FIG. 5, in accordance with the present invention.

Referring to FIG. 6, the present invention may be employed in a dual damascene process. Resist layer 16 and ARC layer 14 are removed from dielectric layer 12. An ARC layer 27 is formed which fills in hole 24. A resist layer 26 is formed on ARC layer 27, exposed and developed to pattern the resist. Resist layer 26 is provided with a wider area to support the formation of a trench for conductive lines, for example, in later steps. As described above, silylation regions 28 are formed in resist layer 26.

Figure 7:
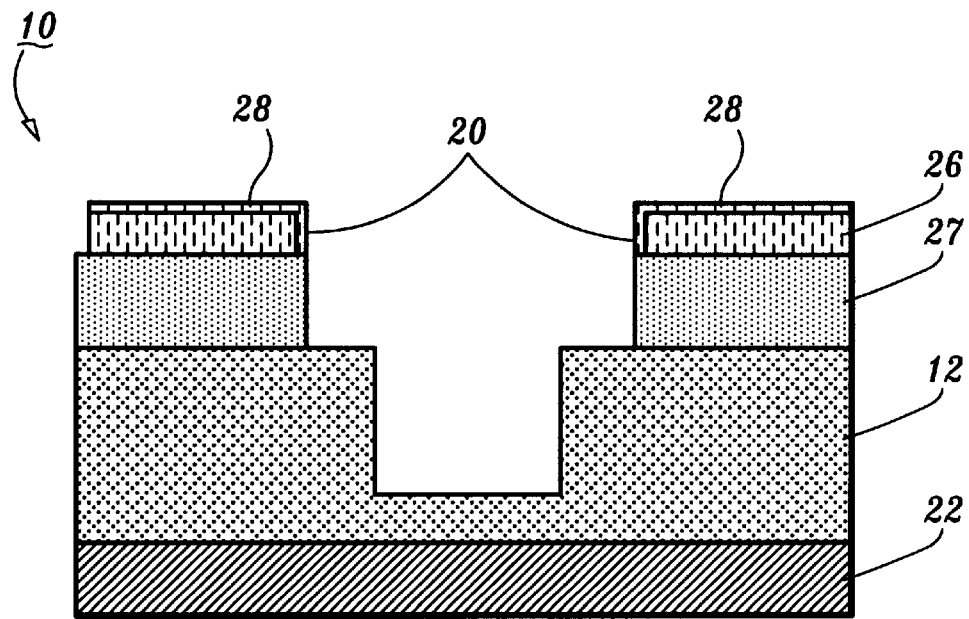
FIG. 7 is a cross-sectional view of the semiconductor device of FIG. 1 showing the antireflection layer opened further in accordance with the present invention.

Referring to FIG. 7, ARC layer 27 is opened to permit a larger opening to be formed and to expose a greater portion of dielectric layer 12. ARC layer 27 is preferably opened and the ARC material is preferably removed using a reactive ion etch process as described above or any anisotropic etch process. Silylation regions 28 function as an etch mask for this etching.

Figure 8:
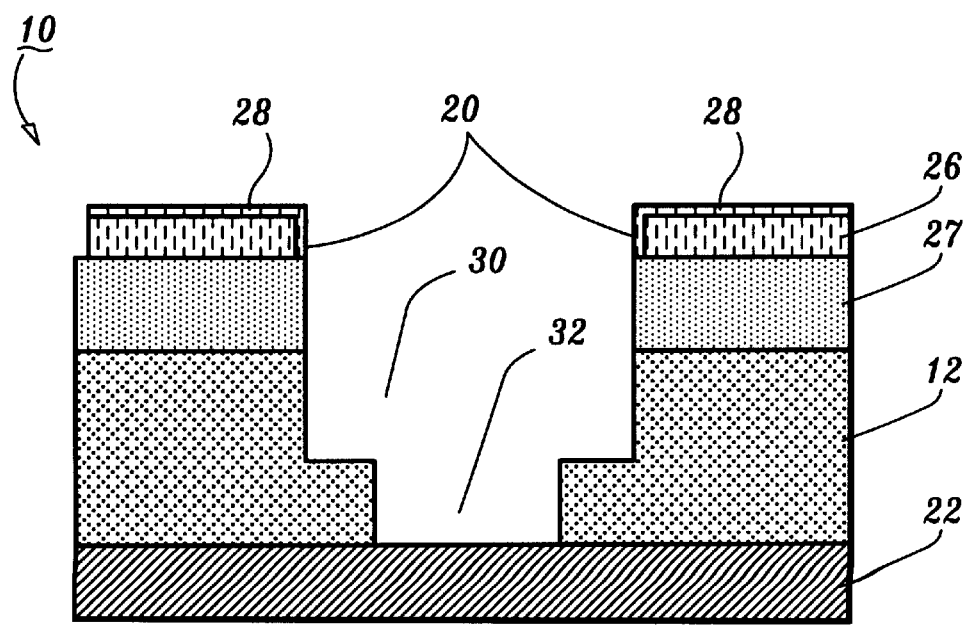
FIG. 8 is a cross-sectional view of the semiconductor device of FIG. 7 showing the dielectric layer etched to form a conductive line trench and a via in accordance with the present invention.
Figure 9:
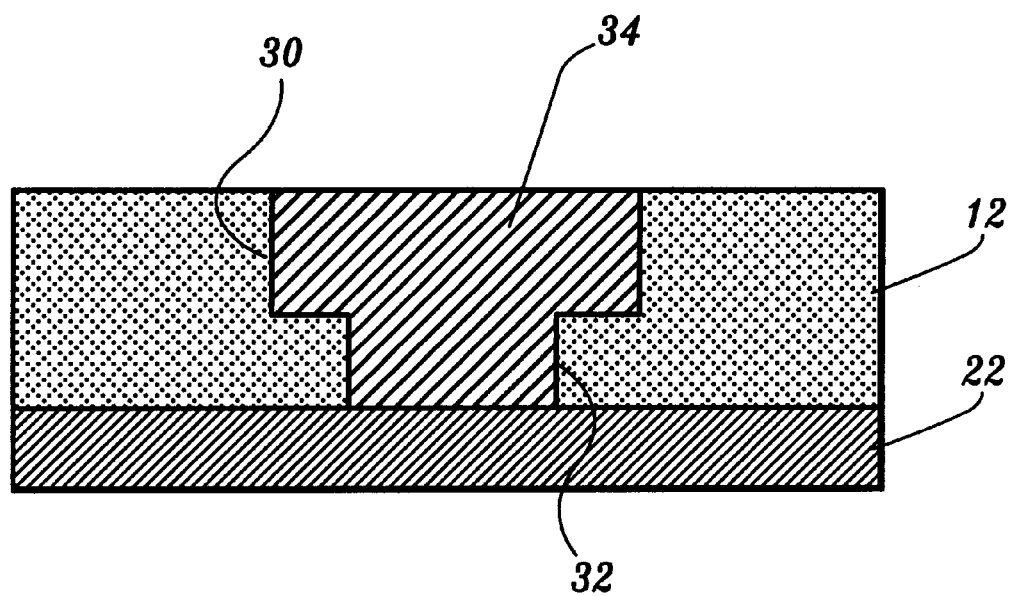
FIG. 9 is a cross-sectional view of the semiconductor device of FIG. 8 showing the conductive line trench and the via filled with conductive material in accordance with the present invention.

Referring to FIG. 8, dielectric layer 12 is etched by employing silylation regions 28 as an etch mask. A conductive line opening 30 is formed in dielectric layer 12, and a via 32 is formed down to layer 22. Opening 30 and via 32 are etched by employing an reactive ion etch process. In other embodiments, via 32 may be formed after opening (or trench) 30 is formed. As shown in FIG. 9, a conductive material 34 is deposited in via 32 and trench 30 to form a conductive line and a contact, concurrently. Processing continues as is known in the art. It is to be understood that the dual damascene structure may be formed in many ways with many processing variations. The description of process steps are illustrative to demonstrate an example of implementation of the present invention.

In accordance with the invention, the silylation of resist layer 16 (or 26) on sidewalls 20 provides the capability of reducing etch bias effects. Critical dimensions (CD) could therefore be biased in such a way by lithographers, so that instead of having to extremely underexpose the resist pattern, they can intentionally overexpose the pattern. This widens the process window. For example, if a trench is to be formed in a dielectric layer having a critical dimension, prior art methods would require the resist used for patterning the dielectric layer to be underexposed (smaller opening in the resist to account for etch biasing which opens up the resist layer (widens it) as well as etching the dielectric layer). By employing the present invention silyation is employed to reduce the etch bias, preventing the resist layer from being widened during etching. The resist pattern can therefore be overexposed and the target critical dimension (CD) in the dielectric layer can still be achieved. Further, silylation of sidewalls 20 to shrink the CD permits a reduction in line shorts due to the improved etch bias. This is advantageous since conventional etch processes will not allow planarization of ARC layers to flatten the pre-lithography surfaces to further reduce CD variations.

Having described preferred embodiments for a silylation method for reducing critical dimension and resist loss (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for maintaining dimensions in a dielectric layer during etching comprising the steps of:

provcaling a dielectric layer having an anti-reflection layer formed thereon;

patterning a resist layer on the anti-reflection layer;

exposing the resist layer to an agent including silicon, the agent for reacting with the resist to form a silylation region on exposed surfaces of the resist layer, the exposed surfaces of resist layer including vertical surfaces adjacent to holes patterned in the resist layer; and etching the anti-reflection layer by employing the silylation regions as an etch mask wherein the silylation regions have a greater resistance to etching than the antireflection layer and the resist layer, the silylated vertical surfaces of the resist layer for providing maintenance of patterned hole dimensions during etching.

2. The method as recited in claim 1, wherein the step of exposing the resist layer to an agent including silicon includes the step of exposing the resist layer to hexamethyl disilazane.

3. The method as recited in claim 2, wherein the hexamethyl disilazane is introduced as a dry chemistry.

4. The method as recited in claim 2, further comprising the step of maintaining a temperature of between about 50 degrees Celsius and about 150 degrees Celsius during the exposing step.

5. The method as recited in claim 2, further comprising the step of maintaining a pressure of between about 1 Torr and about 200 Torr during the exposing step.

6. The method as recited in claim 1, wherein the resist layer includes a deep ultraviolet sensitive resist and the resist layer includes OH agents.

7. The method as recited in claim 1, wherein the step of patterning a resist layer on the anti-reflection layer includes the step of forming the resist layer with a depth smaller than the depth of the anti-reflection layer.

8. A method for maintaining critical dimensions and providing etch resistance to resist materials during etching comprising the steps of:

providing a dielectric layer having an antireflection layer formed thereon;

forming a resist on the antireflection layer;

patterning the resist by employing photolithography;

silylating the resist by employing a dry chemistry silicon-containing agent to form silylation regions on surfaces of the resist, the silylation regions including vertical surfaces adjacent to holes patterned in the resist layer;

etching through the antireflection layer and into the dielectric layer by employing the silylation regions as an etch mask wherein the silylation regions protect the resist layer from scalloping, the silylated vertical surfaces of the resist layer for providing maintenance of patterned hole dimensions during etching.

9. The method as recited in claim 8, wherein the step of silylating the resist includes the step of exposing the resist to hexamethyl disilazane.

10. The method as recited in claim 9, further comprising the step of maintaining a temperature of between about 50 degrees Celsius and about 150 degrees Celsius during the exposing step.

11. The method as recited in claim 9, further comprising the step of maintaining a pressure of between about 1 Torr and about 200 Torr during the exposing step.

12. The method as recited in claim 8, wherein the resist includes a deep ultraviolet sensitive resist and the resist includes OH agents.

13. The method as recited in claim 8, wherein the step of patterning the resist layer includes the step of forming the resist with a depth smaller than the depth of the anti-reflection layer.

14. A method for forming a dual damascene structure comprising the steps of:

providing a dielectric layer having an antireflection layer formed thereon;

patterning a first resist layer on the antireflection layer;

exposing the first resist layer to an agent including silicon, the agent for reacting with the first resist layer to form a silylation region on exposed surfaces of the first resist layer;

etching the anti-reflection layer by employing the silylation regions as an etch mask wherein the silylation regions have a greater resistance to etching than the antireflection layer and the first resist layer;

forming a via in the dielectric layer;

removing the first resist layer;

patterning a second resist layer on the antireflection layer;

exposing the second resist layer to an agent including silicon, the agent for reacting with the second resist layer to form a silylation region on exposed surfaces of the second resist layer;

etching the anti-reflection layer by employing the silylation regions as an etch mask wherein the silylation regions have a greater resistance to etching than the antireflection layer and the second resist layer; and forming a conductor trench in the dielectric layer to form a dual damascene structure.

15. The method as recited in claim 14, wherein the agent including silicon includes hexamethyl disilazane.

16. The method as recited in claim 15, wherein the hexamethyl disilazane is introduced as a dry chemistry.

17. The method as recited in claim 16, further comprising the step of maintaining a temperature of between about 50 degrees Celsius and about 150 degrees Celsius during the exposing steps of the first and second resist layers.

18. The method as recited in claim 16, further comprising the step of maintaining a pressure of between about 1 Torr and about 200 Torr during the exposing steps of the first and second resist layers.

19. The method as recited in claim 14, wherein the resist layer includes a deep ultraviolet sensitive resist and the resist layer includes OH agents.

20. The method as recited in claim 14, wherein the first and second resist layers include a depth smaller than the depth of the anti-reflection layer.

\* \* \* \* \*